United States Patent
Fukatani et al.

(10) Patent No.: US 10,658,562 B2
(45) Date of Patent: May 19, 2020

(54) THERMOELECTRIC CONVERSION MATERIAL, METHOD FOR PRODUCING SAME, AND THERMOELECTRIC CONVERSION MODULE

(71) Applicant: HITACHI METALS, LTD., Tokyo (JP)

(72) Inventors: Naoto Fukatani, Tokyo (JP); Akinori Nishide, Tokyo (JP); Yosuke Kurosaki, Tokyo (JP); Jyun Hayakawa, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 183 days.

(21) Appl. No.: 15/766,752

(22) PCT Filed: Oct. 6, 2016

(86) PCT No.: PCT/JP2016/079772
§ 371 (c)(1),
(2) Date: Apr. 6, 2018

(87) PCT Pub. No.: WO2017/065081
PCT Pub. Date: Apr. 20, 2017

(65) Prior Publication Data
US 2018/0301611 A1 Oct. 18, 2018

(30) Foreign Application Priority Data
Oct. 13, 2015 (JP) .................................. 2015-201866

(51) Int. Cl.
*H01L 35/20* (2006.01)
*H01L 35/34* (2006.01)
(Continued)

(52) U.S. Cl.
CPC .............. *H01L 35/20* (2013.01); *C22C 33/02* (2013.01); *C22C 33/0278* (2013.01);
(Continued)

(58) Field of Classification Search
CPC ..... H01L 35/20; H01L 35/34; C22C 33/0278; C22C 33/02
See application file for complete search history.

(56) References Cited

U.S. PATENT DOCUMENTS

| 10,297,738 B2* | 5/2019 | Nishide .................. C22C 33/02 |
| 2015/0136195 A1 | 5/2015 | Nishide et al. |
| 2015/0179909 A1 | 6/2015 | Nishide et al. |

FOREIGN PATENT DOCUMENTS

| JP | 05-152613 A | 6/1993 |
| JP | 06-045661 A | 2/1994 |

(Continued)

OTHER PUBLICATIONS

International Search Report dated Nov. 22, 2016 of International Application No. PCT/JP2016/0079772.

*Primary Examiner* — C Melissa Koslow
(74) *Attorney, Agent, or Firm* — Volpe and Koenig, P.C.

(57) ABSTRACT

In order to provide an Fe2TiSi type full-Heusler thermoelectric conversion material having a high dimensionless figure-of-merit ZT, the full-Heusler thermoelectric conversion material is characterized in that: the full-Heusler thermoelectric conversion material has secondary crystal grains having an Fe2TiSi type composition and a coating layer covering the circumference of the secondary crystal grains and containing an element other than Fe, Ti, and Si as a main component; and the coating layer has a composition containing an element being dissolvable in a crystal structure of the Fe2TiSi type composition and having an electric resistivity lower than the secondary crystal grains.

11 Claims, 9 Drawing Sheets

STEP 1: PRODUCING Fe₂TiSi TYPE ALLOY POWDER

STEP 2: MIXING Fe₂TiSi TYPE ALLOY POWDER AND ADDITIVE

STEP 3: SINTERING (51) Int. Cl.
    *C22C 45/02*    (2006.01)
    *H01L 35/22*    (2006.01)
    *C22C 33/02*    (2006.01)
(52) U.S. Cl.
    CPC .............. *C22C 45/02* (2013.01); *H01L 35/22* (2013.01); *H01L 35/34* (2013.01)

(56) References Cited

FOREIGN PATENT DOCUMENTS

| JP | 2008-192652 A | 8/2008 |
| JP | 2010-161213 A | 7/2010 |
| JP | 2015-122476 A | 7/2015 |
| WO | 2013/027662 A1 | 2/2013 |
| WO | 2013/175571 A1 | 11/2013 |

* cited by examiner

SECONDARY CRYSTAL GRAIN        ADDITIVE ($Cu_{0.2}Al_{0.8}$)

THERMOELECTRIC CONVERSION MATERIAL, METHOD FOR PRODUCING SAME, AND THERMOELECTRIC CONVERSION MODULE

TECHNICAL FIELD

The present invention relates to: a thermoelectric conversion material having a high thermoelectric conversion efficiency; a method for producing the thermoelectric conversion material; and a thermoelectric conversion module using the thermoelectric conversion material.

BACKGROUND ART

In recent years, increase of energy demand, depletion of fossil fuel such as petroleum, coal, and natural gas as energy sources, and emission of greenhouse gas such as $CO_2$ are big social problems. Meanwhile, in electric power generation using fossil fuel, two thirds of primary energy supply is not utilized and discharged as thermal energy and further the two thirds of that is distributed widely as low temperature heat of lower than 200° C. It is desired to convert such low temperature heat into electric energy efficiently in order to obtain much energy from limited fossil fuel.

As a method for directly converting thermal energy into electric energy, there is a thermoelectric conversion technology using Seebeck effect. The thermoelectric conversion technology can convert energy without emitting a greenhouse gas and can be applied even in the low temperature region of lower than 200° C. Electric power generation that uses unused low temperature heat and causes a small impact on the environment therefore is expected to be obtained by using the thermoelectric conversion technology.

There is a figure-of-merit Z as an index showing the performance of a thermoelectric conversion material. Since a figure-of-merit Z has the dimension of $[K^{-1}]$, a dimensionless figure-of-merit ZT obtained by multiplying Z by an average temperature T and represented by the following expression (1) is used. T is an average temperature (absolute temperature), S is a Seebeck coefficient, p is an electric resistivity, and κ is a thermal conductivity.

$$ZT = \frac{S^2}{\rho \kappa} T \quad (1)$$

As a thermoelectric conversion material having an excellent dimensionless figure-of-merit ZT in a low temperature region of lower than 200° C., a full-Heusler alloy represented by an $Fe_2VAl$ type alloy is known for example. Such a full-Heusler alloy: comprises elements that are non-toxic, low-priced, and abundantly reserved; and attracts attention in recent years also from the viewpoint of impact on the environment. A full-Heusler alloy has a large Seebeck coefficient S. A full-Heusler alloy has a high thermal conductivity κ and a high electric resistivity p however and hence a dimensionless figure-of-merit ZT cannot be increased to a practical level.

As a measure against the problem, in PTL 1, a method of obtaining a high dimensionless figure-of-merit ZT by reducing a thermal conductivity κ is studied. Specifically, a complex thermoelectric conversion material having a thermal conductivity lowered by complexing and sintering a full-Heusler alloy and an additive of a low thermal conductivity is disclosed. As a method for producing such a thermoelectric conversion material, disclosed is a method of: alloying a thermoelectric conversion material having a composition represented by the general expression $(Fe_{1-x}M_x)_2V_{1-y}L_yAl_{1-z}R_z$ (in the expression, M is at least one element selected from the group of Co, Ni, Pd, Ir, and Pt, L is at least one element selected from the group of Ti, Cr, Mn, Zr, and Mo, R is at least one element selected from the group of Mg, Si, P, S, Ca, Ge, Sn, Sb, and Bi, and the expressions $0 \leq x \leq 0.2$, $0 \leq y \leq 0.2$, and $0 \leq z \leq 0.2$ are satisfied) by mechanical alloying; successively mixing Bi as an additive of a low thermal conductivity; and applying electric current sintering to them under pressure. The disclosure says that, by the method, a material of a low thermal conductivity can be dispersed evenly and finely in a structure and resultantly a thermoelectric conversion material having a high thermoelectric conversion efficiency is obtained.

Further, in PTL 2, a full-Heusler alloy of a $Fe_2TiSi$ type is disclosed. Specifically, disclosed is a thermoelectric conversion material that is represented by the composition formula $Fe_{2+\sigma}Ti_{1+y}Si_{1+z}$ and has values of σ, y, and z allowing the thermoelectric conversion material to fall within a region surrounded by points (50, 37, 13), (50, 14, 36), (45, 30, 25), (39.5, 25, 35.5), (54, 21, 25), and (55.5, 25, 19.5) {excluding (50, 25, 25)} in terms of (Fe, Ti, Si) in at % in an Fe—Ti—Si ternary alloy phase diagram.

CITATION LIST

Patent Literature

PTL 1: Japanese Patent Application Laid-Open No. 2008-192652

PTL 2: Japanese Patent Application Laid-Open No. 2015-122476

SUMMARY OF INVENTION

Technical Problem

In PTL 1, a dimensionless figure-of-merit ZT is attempted to improve by adding an additive of a low thermal conductivity κ (specifically Bi) to a full-Heusler thermoelectric conversion material of an $Fe_2VAl$ type. In this context, the present inventors have conducted an experiment of adding such Bi as described in PTL 1 to a full-Heusler thermoelectric conversion material of an $Fe_2TiSi$ type described in PTL 2. In the thermoelectric conversion material obtained through the experiment however, it cannot be said that the thermal conductivity κ is reduced sufficiently, and a thermoelectric conversion material having a high dimensionless figure-of-merit ZT is not obtained.

Yet another means has to be studied in order to improve a dimensionless figure-of-merit ZT in a thermoelectric conversion material of an $Fe_2TiSi$ type.

An object of the present invention is to provide: a full-Heusler thermoelectric conversion material of an $Fe_2TiSi$ type having a high dimensionless figure-of-merit ZT; and a thermoelectric conversion module of a high thermoelectric conversion efficiency using the full-Heusler thermoelectric conversion material. Further, another object of the present invention is to provide a method for producing a full-Heusler thermoelectric conversion material of an $Fe_2TiSi$ type having a high dimensionless figure-of-merit ZT.

Solution to Problem

An embodiment to attain the above objects is a thermoelectric conversion material comprising a full-Heusler alloy containing Fe, Ti, and Si as main raw materials, having:

secondary crystal grains having an $Fe_2TiSi$ type composition; and a coating layer covering the circumference of the secondary crystal grains and containing an element other than Fe, Ti, and Si as a main component, wherein the coating layer has a composition containing an element being dissolvable in a crystal structure of the $Fe_2TiSi$ type composition and having an electric resistivity lower than the secondary crystal grains.

Further, an embodiment is a thermoelectric conversion module having a plurality of thermoelectric conversion elements each of which has a P-type thermoelectric conversion material, an N-type thermoelectric conversion material, and an electrode connecting the P-type thermoelectric conversion material and the N-type thermoelectric conversion material, wherein, at least either of the N-type thermoelectric conversion material and the P-type thermoelectric conversion material is a thermoelectric conversion material which comprises a full-Heusler alloy containing Fe, Ti, and Si as main raw materials and has secondary crystal grains having an $Fe_2TiSi$ type composition and a coating layer covering the circumference of the secondary crystal grains and containing an element other than Fe, Ti, and Si as a main component; and the coating layer has a composition containing an element being dissolvable in a crystal structure of the $Fe_2TiSi$ type composition and having an electric resistivity lower than the secondary crystal grains.

Furthermore, an embodiment is a method for producing a thermoelectric conversion material, comprising the steps of:

producing alloy powder of an alloy having a composition of an $Fe_2TiSi$ type;

adding an additive having a composition containing an element other than Fe, Ti, and Si, the element being dissolvable in the alloy powder and having an electric resistivity lower than the alloy to the alloy powder; and sintering a mixture of the alloy powder and the additive so as not completely to dissolve.

Advantageous Effects of Invention

The present invention makes it possible to provide: a thermoelectric conversion material that is a full-Heusler alloy of an $Fe_2TiSi$ type and has a high dimensionless figure-of-merit ZT; and a thermoelectric conversion module using the thermoelectric conversion material and having a high thermoelectric conversion efficiency. Further, the present invention makes it possible to provide a method for producing a thermoelectric conversion material having a structure that can reduce an electric resistivity p and increase a dimensionless figure-of-merit ZT.

DESCRIPTION OF EMBODIMENTS

The present inventors have studied a completely different means in the study of improving a dimensionless figure-of-merit ZT in a thermoelectric conversion material comprising a full-Heusler alloy of an $Fe_2TiSi$ type in view of the fact that improvement effect of the full-Heusler alloy of an $Fe_2TiSi$ type is not obtained at all even in a structural form similar to a full-Heusler alloy of an $Fe_2VAl$ type described in PTL 1.

As a result, it has been found that, in the case of a thermoelectric conversion material comprising a full-Heusler alloy containing Fe, Ti, and Si as main raw materials, a configuration of covering the circumference of secondary crystal grains having a composition of an $Fe_2TiSi$ type with a coating layer containing an element other than Fe, Ti, and Si, the element being dissolvable in a crystal structure of the $Fe_2TiSi$ type composition and having an electric resistivity lower than the secondary crystal grains, as a main component is effective for the improvement of a dimensionless figure-of-merit ZT.

That is, PTL 1 is a technology of using a full-Heusler alloy of a $Fe_2VAl$ type and dispersing a material of a low thermal conductivity evenly and finely in a structure. In contrast, the present invention is a technology of: using a full-Heusler alloy of an $Fe_2TiSi$ type; and, by using a component dissolvable in the main composition as an additive, not only precipitating a material having a composition of a low electric resistivity among secondary crystal grains or the like but also forming a coating layer so as to cover the circumference of the secondary crystal grains. Here, a secondary crystal grain means a substance formed by aggregating one or a plurality of primary crystal grains having a composition of an $Fe_2TiSi$ type by sintering. Further, a component dissolvable in the main composition of an $Fe_2TiSi$ type full-Heusler alloy means that the component can maintain the full-Heusler type crystal structure and form a solid solution even when the component is added. On this occasion, a solid solution means a crystalline solid of a uniform phase comprising two or more kinds of elements as defined in JIS G0201:2000. Furthermore, it is preferable for a coating layer to have a composition containing an element other than Fe, Ti, and Si, the element having an electric resistivity lower than the secondary crystal grains, as a main component in order to reduce an electric resistivity p and a thermal conductivity κ. Specifically, as a composition of the coating layer, the total amount of Fe, Ti, and Si is preferably 3 at % or less, more preferably 1 at % or less, or still more preferably 0.5 at % or less of the whole coating layer.

An additive added to a full-Heusler alloy is explained hereunder. An additive is to be dissolvable in an alloy having a composition of a Fe$_2$TiSi type. The reason is that a crystal structure shown in FIG. 1, namely a thermoelectric conversion material, is not obtained with an additive that is not dissolvable. An additive having a solid solution start temperature lower than a crystallization temperature of a full-Heusler alloy is preferable. The reason is that it is preferable to produce the crystal structure at a temperature in the vicinity of the crystallization temperature (450° C. to 800° C.) in order to inhibit the grain growth of an Fe$_2$TiSi type full-Heusler alloy. As such an additive, at least one element selected from the group of Li, Mg, Al, Cu, Zn, Sn, Ba, and Pb can be used for example. As an additive in particular, it is preferable that at least one element selected from the group of Mg, Al, and Cu is used. Further, by using an alloy of Mg and Al, Cu and Al, or the like and adjusting a melting point and wettability, it is preferable that the alloy comes to be a liquid phase at a temperature in the vicinity of the crystallization temperature of a full-Heusler alloy (450° C. to 800° C.) and the additive can disperse evenly over the surfaces of secondary particles.

Figure 1:
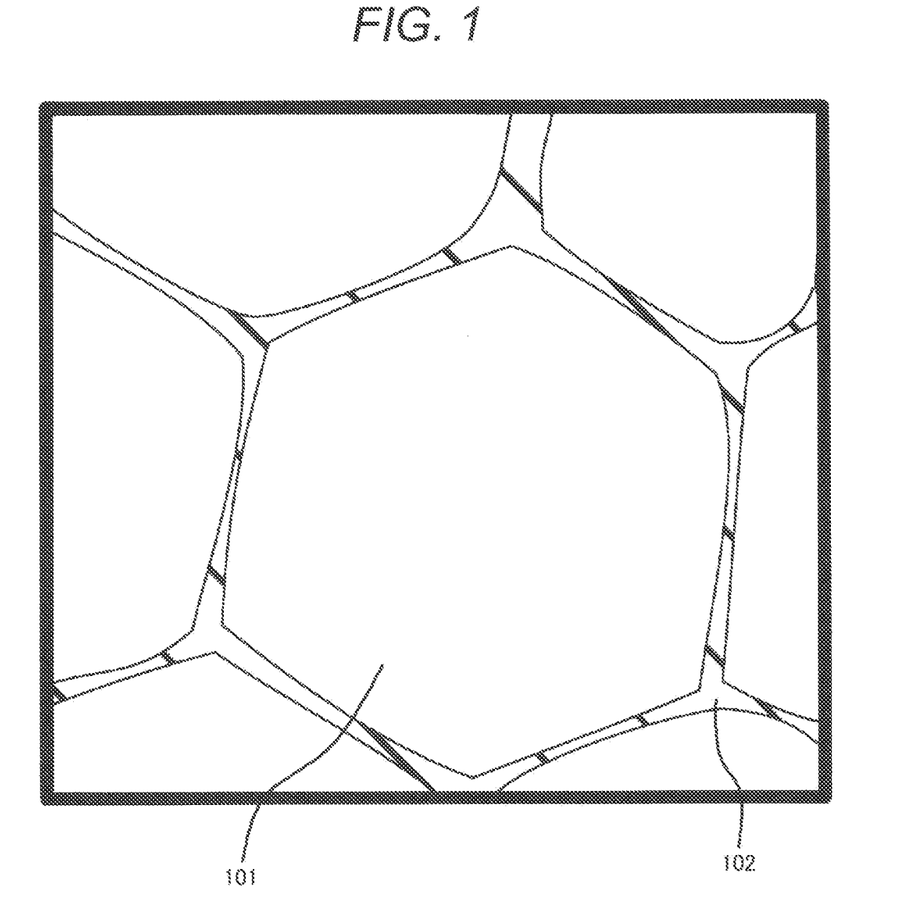
FIG. 1 is a schematic view of a structure of a thermoelectric conversion material according to an embodiment of the present invention.

FIG. 1 is a schematic view of a structure (crystal structure) of a thermoelectric conversion material according to an embodiment of the present invention. A coating layer 102 comprising an additive covers the circumference of a secondary crystal grain 101 of a Fe$_2$TiSi type. A dimensionless figure-of-merit does not improve even when an additive of a low electric resistivity is dispersed evenly and finely in a structure as described in PTL 1. It is important for such secondary crystal grains and a coating layer to be precipitated so as to be formed as stated above in order to improve a dimensionless figure-of-merit ZT. Although a production method for that will be described later, to add an element dissolvable in Fe$_2$TiSi type alloy powder before sintered is an important point in the production.

If an element not dissolving in Fe$_2$TiSi type alloy powder is used as an additive, the component of the additive aggregates mainly at triple points of secondary crystal grains by sintering like PTL 1 undesirably. In the present invention, an additive can be formed as a coating layer covering the circumference of secondary crystal grains by using an element dissolvable in an alloy having an Fe$_2$TiSi type composition as the additive and for example sintering the additive at a temperature in the vicinity of the crystallization temperature of the Fe$_2$TiSi type alloy so as not completely to dissolve. It is estimated that, by using a dissolvable element, an additive is likely to move along the grain boundaries of secondary crystal grains and a crystal structure of covering the secondary crystal grains with the additive is obtained.

Figure 3:
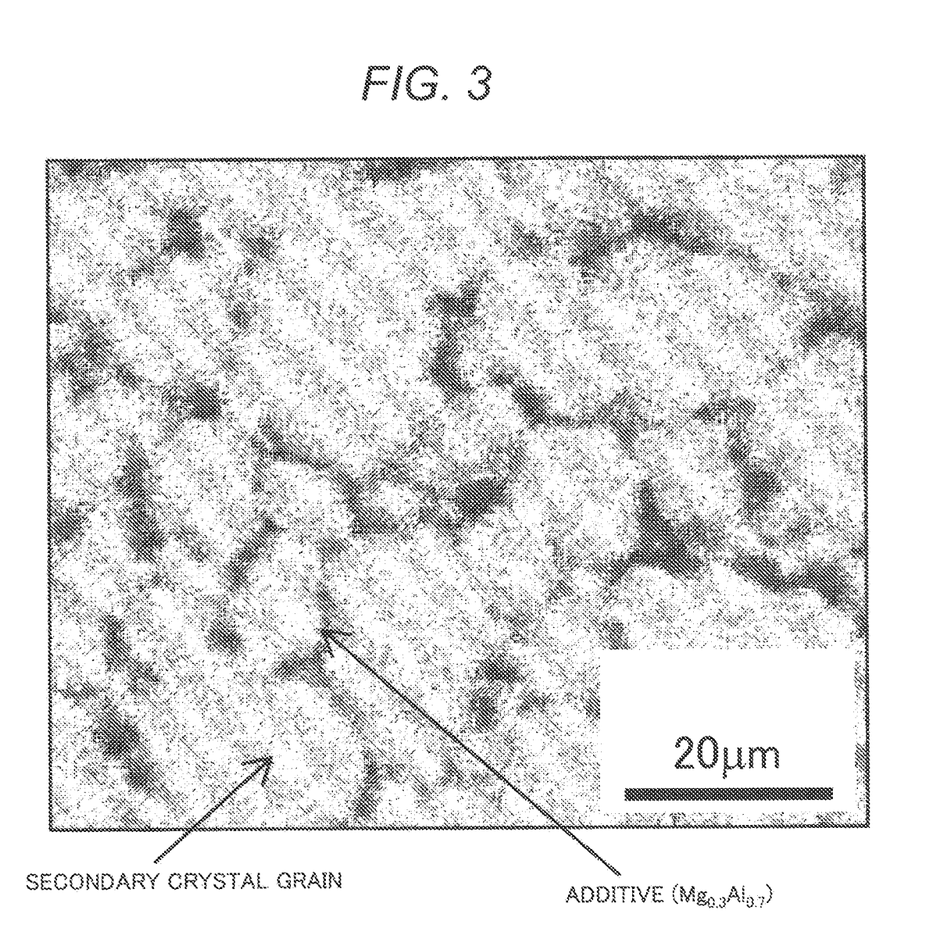
FIG. 3 is an electron micrographic image showing a structure of a thermoelectric conversion material (MgAl added) according to Example 1 of the present invention.
Figure 4:
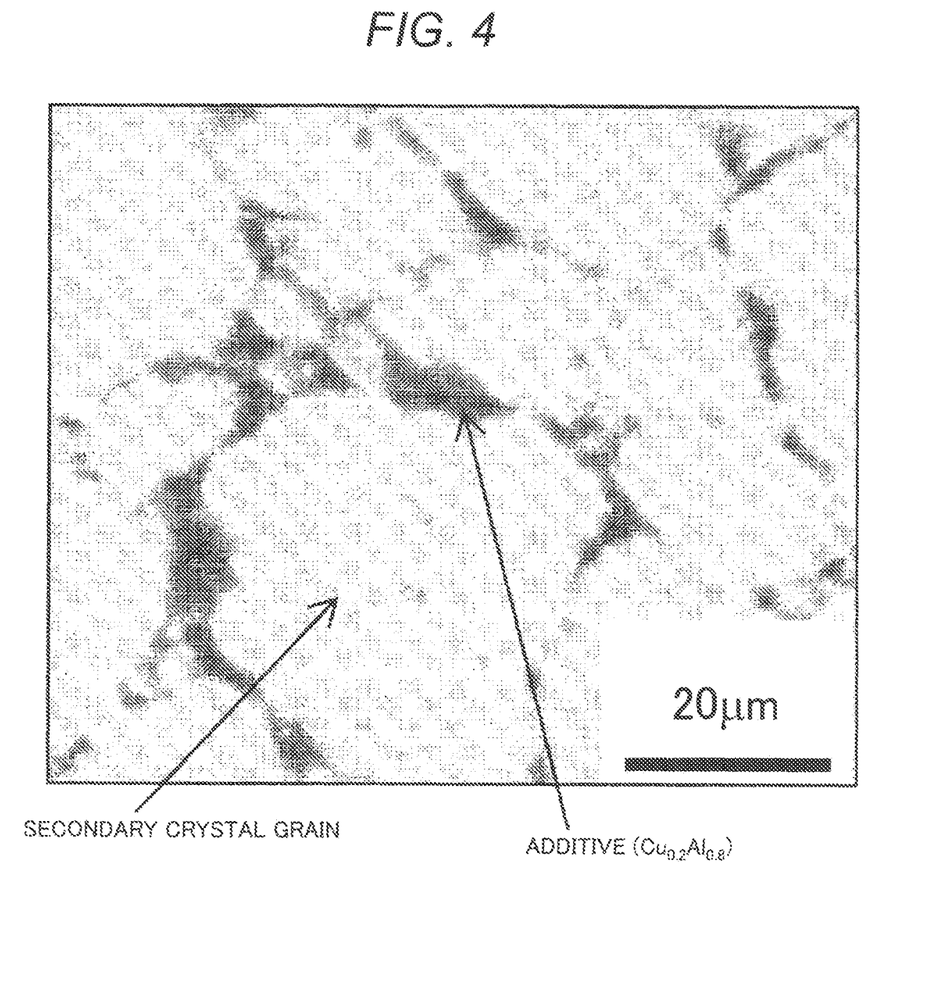
FIG. 4 is an electron micrographic image showing a structure of a thermoelectric conversion material (CuAl added) according to Example 2 of the present invention.
Figure 5:
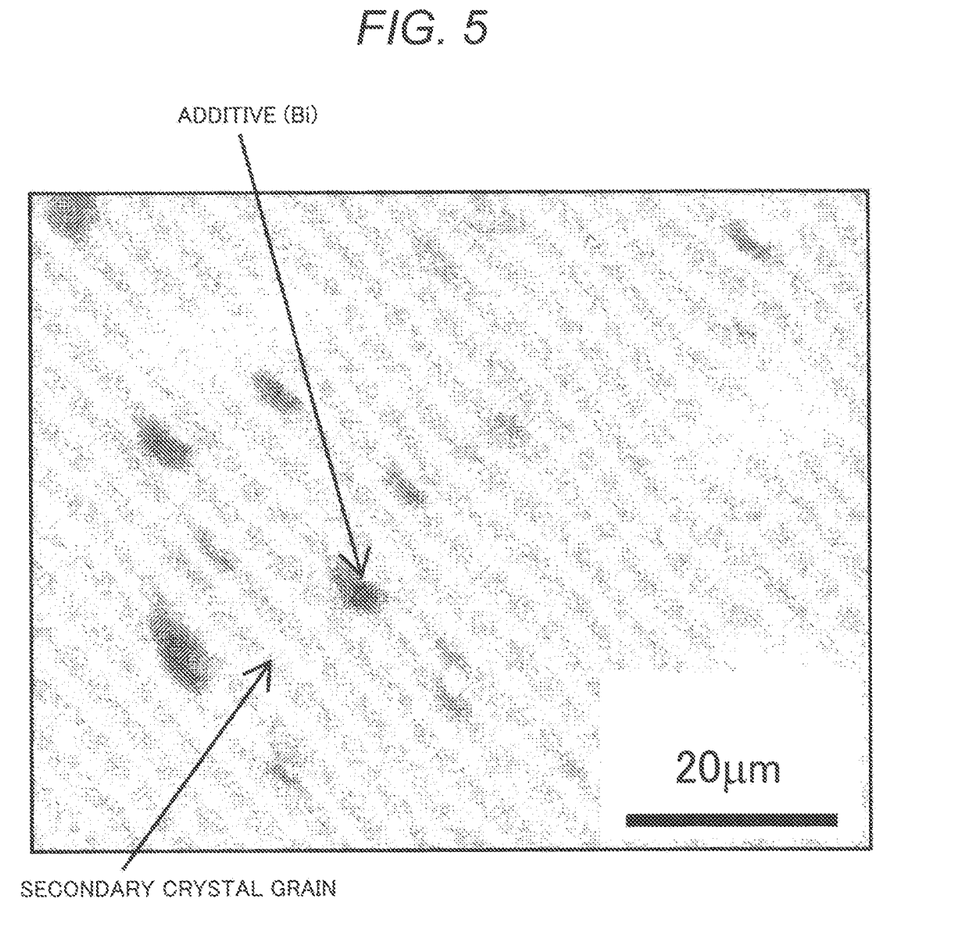
FIG. 5 is an electron micrographic image showing a structure of a thermoelectric conversion material (Bi added) according to Comparative example 1 of the present invention.

FIGS. 3 to 5 are electron micrographic images of the structures of thermoelectric conversion materials according to examples. In FIGS. 3 to 5, the structures of the thermoelectric conversion materials shown in the figures are confirmed by energy dispersive X-ray spectroscopy with a scanning electron microscope. Here, the magnification is set at 1,500.

As a full-Heusler alloy containing Fe, Ti, and Si as main raw materials, a full-Heusler alloy of an N-type or a P-type obtained by containing Fe, Ti, and Si as main raw materials and for example partially substituting at least one element selected from the group of V, Ru, Cr, Mn, Co, Ni, Cu, Zr, Nb, Mo, Hf, Ta, W, Al, Sn, Ge, Ir, In, and Ga can be used. A thermal conductivity κ of a full-Heusler alloy can be reduced further by substituting, among those, a heavy element such as Ru, Zr, Nb, Mo, Hf, Ta, W, Sn, Ge, Ir, In, or Ga. Further, it is also possible to control the number of valence electrons precisely or improve phase stability by substituting an element such as V, Cr, Mn, Co, Ni, Cu, or Al.

In a full-Heusler alloy containing Fe, Ti, and Si as main raw materials, a secondary crystal grain comprising a plurality of primary crystal grains having an Fe$_2$TiSi type composition can be recognized. The compositions of the primary crystal grains and the secondary crystal grain are substantially identical.

As a composition of secondary crystal grains, a composition represented by Fe$_2$(Ti$_{1-a}$M1$_a$)(Si$_{1-b}$M2$_b$) (here, M1 is a composition comprising at least one element selected from the group of V, Ru, Cr, Mn, Co, Ni, Cu, Zr, Nb, Mo, Hf, Ta, W, and Ir, M2 is a composition comprising at least one element selected from the group of Cu, Al, Ge, In, Sn, and Ga, and the expressions 0≤a≤0.2 and 0≤b≤0.2 are satisfied) can be used.

Meanwhile, the molar ratio of Fe:(Ti$_{1-a}$M1$_a$):(Si$_{1-b}$M2$_b$) is basically 2:1:1 but may deviate. Specifically, any composition is acceptable as long as the composition falls within the region α surrounded by the straight lines connecting the six large black round points (50, 37, 13), (45, 30, 25), (39.5, 25, 35.5), (50, 14, 36), (54, 21, 25), and (55.5, 25, 19.5) in terms of (Fe, (Ti$_{1-a}$M1$_a$), (Si$_{1-b}$M2$_b$)) in at % on the ternary alloy phase diagram in FIG. 9.

Figure 9:
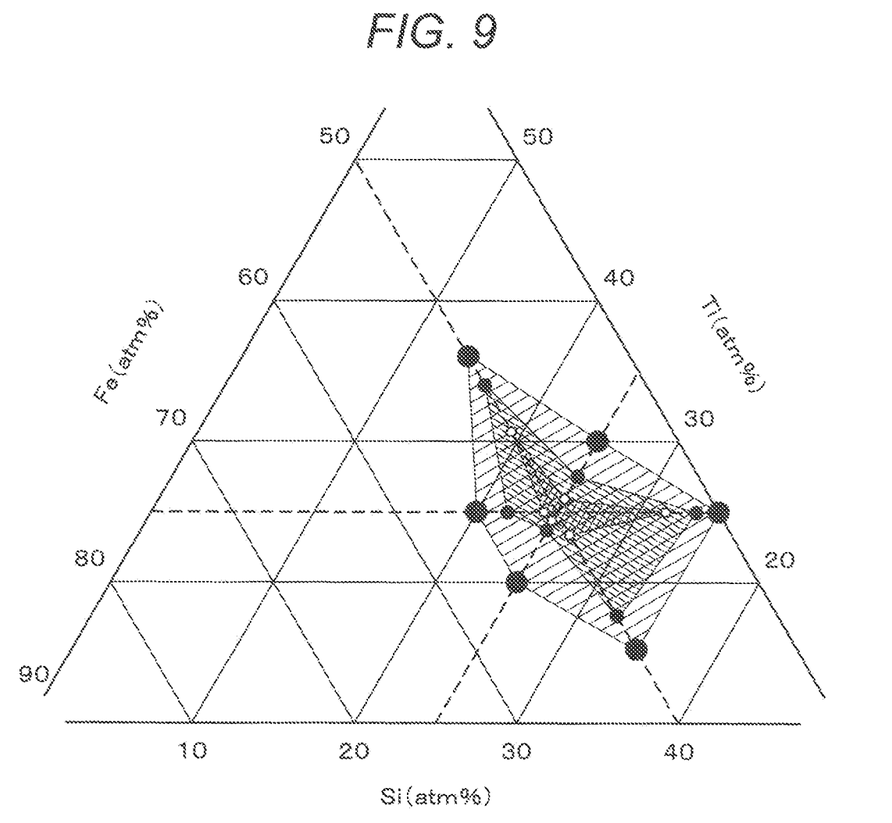
FIG. 9 is a ternary alloy phase diagram showing composition ranges of full-Heusler alloys in thermoelectric conversion materials according to an embodiment of the present invention.

Further, a characteristic is particularly good when a composition falls within the region β surrounded by the straight lines connecting the six small black round points (50, 35, 15), (47.5, 27.5, 25), (40, 25, 35), (50, 17, 33), (52.2, 22.8, 25), and (52.8, 25, 22.2) in terms of (Fe, (Ti$_{1-a}$M1$_a$), (Si$_{1-b}$M2$_b$)). A composition region of a yet better characteristic is the region γ surrounded by the straight lines connecting the six white circles (50, 32.6, 17.4), (49.2, 25.8, 25), (43.9, 25, 31.1), (50, 23, 27), (51, 24, 25), and (51, 25, 24) in terms of (Fe, (Ti$_{1-a}$M1$_a$), (Si$_{1-b}$M2$_b$)).

Figure 8:
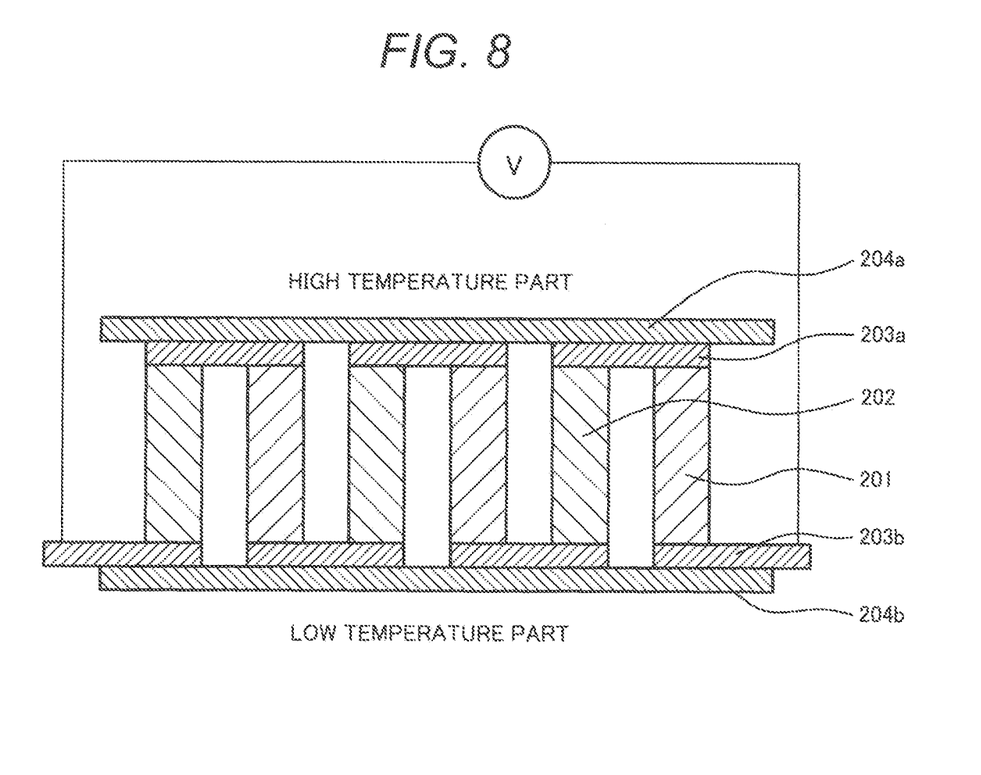
FIG. 8 is a schematic sectional view showing an example of a thermoelectric conversion module using a thermoelectric conversion material according to an embodiment of the present invention.

FIG. 8 is a schematic sectional view showing an example of a thermoelectric conversion module using a thermoelectric conversion material according to an embodiment of the present invention. The thermoelectric conversion module has a structure obtained by: forming a π-shaped structure including a pair of thermoelectric conversion elements by connecting an N-type thermoelectric conversion material 201 and a P-type thermoelectric conversion material 202 with electrodes 203a and 203b; connecting a plurality of the thermoelectric conversion elements so as to align the N-type thermoelectric conversion materials 201 and the P-type thermoelectric conversion materials 202 alternately with the electrodes 203a and 203b; and moreover connecting heat transfer materials 204a and 204b over the electrodes 203a and 203b. The thermoelectric conversion module can extract electric energy efficiently from both the ends of the electrodes (both the ends of the electrode 203b at the right end and the electrode 203b at the left end in FIG. 8) when the whole module is subjected to temperature difference by heating a surface (the surface on the side of arranging the heat transfer material 204a in FIG. 8) of the module by a heat source and cooling the other surface (the surface on the side of arranging the heat transfer material 204b in FIG. 8) by water cooling or air cooling.

A production method for obtaining a thermoelectric conversion material according an embodiment of the present invention is explained hereunder.

Figure 2:
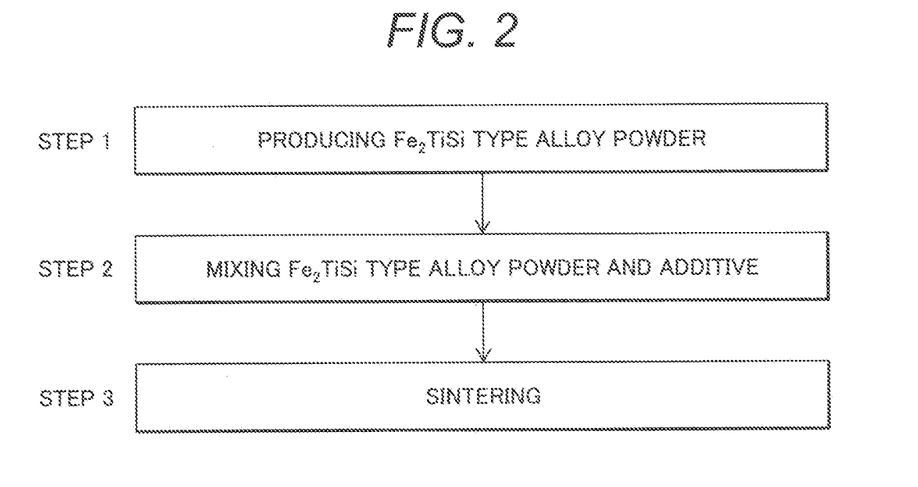
FIG. 2 is a flowchart in the production of a thermoelectric conversion material according to an embodiment of the present invention.

A production method of such a thermoelectric conversion material, as shown in FIG. 2, includes: a step of producing alloy powder of an $Fe_2TiSi$ type (Step 1); a step of adding an additive having a composition containing an element other than Fe, Ti, and Si, the element being dissolvable in a crystal structure of an $Fe_2TiSi$ type and having an electric resistivity lower than secondary crystal grains, to the alloy powder (Step 2); and a step of sintering the mixture of the alloy powder and the additive so as not completely to dissolve both the alloy powder and the additive (Step 3). Through the sintering step, secondary crystal grains having an $Fe_2TiSi$ type composition are formed and simultaneously a coating layer that covers the circumference of the secondary crystal grains and contains an element other than Fe, Ti, and Si, the element being dissolvable in the crystal structure of an $Fe_2TiSi$ type and having an electric resistivity lower than the secondary crystal grains, as a main component is formed.

Step 1 is explained further. Raw material powder of the respective elements Fe, Ti, and Si is weighed so that the composition ratio of a full-Heusler alloy may fall within the region of α, β, or γ shown in FIG. 9 and alloyed and thus alloy powder is obtained.

The alloy powder may preferably be an amorphous alloy. In order to obtain an amorphous alloy, mechanical alloying or a super-rapid cooling method can be used. When mechanical alloying is used, the condition of forming an amorphous alloy at a rotational speed of 250 to 500 rpm for 5 to 100 hours is preferable. Here, the structure of an amorphous material is not limited to being completely amorphous but may be an amorphous material having a long-range order or a short-range order.

Step 2 is explained further. An additive having a composition containing an element other than Fe, Ti, and Si, the element being dissolvable in the alloy powder and having an electric resistivity lower than the alloy, is added to and mixed with the alloy powder obtained at Step 1. If Fe, Ti, or Si is added, the composition ratio of the main components changes and a thermoelectric conversion material having a high dimensionless figure-of-merit ZT is not obtained. Further, if an element not dissolving in alloy powder is used as an additive, the component of the additive aggregates mainly at triple points of secondary crystal grains through sintering as stated earlier and a thermoelectric conversion material having such a structure intrinsic to the present invention as to cover the circumference of the secondary crystal grains with a coating layer is not obtained.

The additive is composed so as to have an electric resistivity lower than the alloy powder. Although it is specified below, the electric resistivity of a thermoelectric conversion material can be reduced and resultantly a dimensionless figure-of-merit ZT can be improved.

Further, the solid solution start temperature of an additive is preferably lower than the crystallization temperature of a full-Heusler alloy. The reason is that it is preferable to produce a crystal structure of a thermoelectric conversion material at a temperature in the vicinity of the crystallization temperature of a full-Heusler alloy in order to dissolve an additive in the full-Heusler alloy and inhibit the grain growth of crystal grains in the full-Heusler alloy while a coating layer is formed. The crystallization temperature of a full-Heusler alloy of an $Fe_2TiSi$ type used for a thermoelectric conversion material according to the present embodiment is 500° C. to 600° C.

With regard to a composition of an additive, as stated earlier, at least one element selected from the group of Li, Mg, Al, Cu, Zn, Sn, Ba, and Pb can be used for example. As an additive in particular, at least one element selected from the group of Mg, Al, and Cu is used preferably.

Further, as an additive, at least one element selected from the group of Mg and Al is used more preferably. It is still more preferable to use an alloy of Mg and Al as an additive because a coating layer is likely to be formed by lowering the melting point of the additive to a temperature not higher than a temperature at which the additive melts during sintering. Specifically, the composition of an MgAl alloy having a melting point of about 600° C. or lower is a composition satisfying the expression x=0.1 to 0.9 in the composition formula $Mg_{1-x}Al_x$.

An addition amount of an additive is preferably more than 0 vol % to 6 vol % or less of the total amount of the alloy powder and the additive. As long as the addition amount is in this range, a thermoelectric conversion material having a dimensionless figure-of-merit ZT larger than a material produced without using an additive can be obtained. A more preferable range is 2 vol % to 5.5 vol %.

Step 3 is explained further. Mixed powder obtained at Step 2 is sintered so as not completely to dissolve the alloy powder and the additive. By applying the sintering, secondary crystal grains having a composition of an $Fe_2TiSi$ type are formed and simultaneously a coating layer covering the circumference of the secondary crystal grains and containing an element other than Fe, Ti, and Si, the element being dissolvable in a crystal structure of the $Fe_2TiSi$ type and having an electric resistivity lower than the secondary crystal grains, as a main component is formed.

As concrete conditions of the sintering, when a sintering temperature is defined as Ts, a melting point of an additive is defined as Tm, and a temperature of completely dissolving an additive into alloy powder of a $Fe_2TiSi$ type is defined as Tu, the sintering is applied preferably so as to satisfy the expression Tm<Ts<Tu. By controlling a sintering temperature Ts so as to be higher than a melting point Tm of an additive and lower than a temperature Tu of completely dissolving the additive into alloy powder, a thermoelectric conversion material in which a coating layer having the composition of the additive is formed more widely around secondary crystal grains of an $Fe_2TiSi$ type is obtained. The coating layer functions as an ultrathin electrically conductive layer between alloy grains and resultantly an electric resistivity ρ can be reduced.

A sintering temperature is preferably 1,000° C. or lower. By controlling a sintering temperature in the range, the grain growth of a full-Heusler alloy is inhibited and hence the grain size of primary crystal grains contained in secondary crystal grains is reduced. As a result, phonons responsible for heat conduction are likely to disperse efficiently, a thermal conductivity κ lowers, and a dimensionless figure-of-merit ZT can be improved. A more preferable sintering temperature is from 450° C. to 800° C. in order to obtain the effects of dispersing an additive evenly, attaining densification, and reducing a sintering time.

A retention time of sintering: may be any time as long as the time is one minute or longer that is the time allowing a full-Heusler alloy to crystallize; and is usually 10 hours or shorter. A retention time of sintering is preferably from 0.1 hour to 5 hours. As a sintering atmosphere, a degree of vacuum of 100 Pa or lower is preferable in order to prevent oxidation during sintering. A more preferable degree of vacuum is 50 Pa or lower. Further, a pressure applied during sintering is preferably 40 MPa or more that is the pressure of densifying a full-Heusler alloy. A more preferable pressure is 300 MPa or more.

The present invention is explained hereunder on the basis of examples.

Example 1

Example 1 according to the present invention is explained. Here, it goes without saying that the above items described in the section of "Description of Embodiments" can apply also to the present example unless otherwise specified. In the present example, Fe, Ti, and Si were used as main raw materials of a full-Heusler alloy and V was used as an element for obtaining an N-type thermoelectric conversion characteristic by adjusting the number of valence electrons.

10 g in total of raw material powder of respective elements was weighed so as to obtain the composition of $Fe_{1.98}Ti_{0.87}V_{0.08}Si_{1.07}$. A planetary ball mill was prepared by putting the raw material powder and SUS balls 10 mm in diameter into a SUS pot and sealing the SUS pot with an O-ring. Those works were carried out at an oxygen concentration of 0.01% or less under an Ar atmosphere. $Fe_2TiSi$ type alloy powder having an amorphous structural form having the above composition was produced by mixing the raw materials sufficiently under the conditions of 100 rpm and 1 hour and successively applying mechanical alloying under the conditions of 350 rpm and 25 hours with the planetary ball mill. The average grain size of the $Fe_2TiSi$ type alloy powder was about 20 μm.

Successively, an additive comprising alloy powder of $Mg_{0.3}Al_{0.7}$ (hereunder referred to as an MgAl additive) was added to the $Fe_2TiSi$ type alloy powder. The purpose of the alloy powder is to form a coating layer covering the circumference of secondary crystal grains of a $Fe_2TiSi$ type and having a low electric resistivity. Mg and Al are elements having melting points lower than the $Fe_2TiSi$ type alloy powder and being dissolvable in the $Fe_2TiSi$ type alloy powder. The amount of the added MgAl additive was set at 4 vol % of the total volume of the mixed powder. The mixed powder was obtained by mixing the $Fe_2TiSi$ type alloy powder and the MgAl additive sufficiently under the mixing conditions of 100 rpm and 1 hour as stated above for example with the planetary ball mill.

Successively, the mixed powder was sintered by a discharge plasma sintering method. A cylindrical carbon jig 5 mm in inner diameter and 40 mm in height was inserted into a tungsten carbide die, tungsten carbide punches were inserted above and below, and sintering was applied while pressure was applied from above and below. Since the melting point of the MgAl additive is 440° C. and the crystallization temperature of the $Fe_2TiSi$ type alloy powder is 550° C., the sintering temperature was set at 600° C. that is a temperature higher than those temperatures and lower than a temperature at which both the MgAl additive and the $Fe_2TiSi$ type alloy powder are completely alloying (800° C. or lower in the present example). The retention time was set at 30 minutes. The applied pressure during sintering was set at 1,000 MPa. As the annealing atmosphere, an Ar atmosphere of a degree of vacuum of 10 Pa or less was adopted.

The grain sizes of the primary crystal grains were obtained from the half width of an X-ray diffraction spectrum with a Scherre formula and were 20 to 100 nm. Further, as a result of the observation with a scanning electron microscope, it was found that the secondary crystal grains were formed by aggregating the primary crystal grains. The secondary crystal grains could be observed at a magnification of about 1,500 with the same scanning electron microscope and resultantly the grain sizes were 5 to 20 μm.

FIG. 3 is a photograph obtained by polishing the surface of a sintered body produced according to the present example and observing the structure by energy dispersive X-ray spectroscopy with a scanning electron microscope. The coating layer formed from the MgAl additive (blackish parts) is formed in the manner of covering the secondary crystal grains (whitish parts). The dimensionless figure-of-merit ZT of the obtained thermoelectric conversion material was 0.213.

In this way, according to the present example, it is possible to provide a $Fe_2TiSi$ type full-Heusler thermoelectric conversion material having a high dimensionless figure-of-merit ZT. Further it is possible to provide a method for producing a $Fe_2TiSi$ type full-Heusler thermoelectric conversion material having a high dimensionless figure-of-merit ZT.

Example 2

Example 2 according to the present invention is explained. Here, the items described in Example 1 but not described in the present example can apply also to the present example unless otherwise specified. In the present example, an additive comprising $Cu_{0.2}Al_{0.8}$ alloy powder (hereunder referred to as a CuAl additive) is used as the additive and production and evaluation are carried out by using the raw material powder and the conditions similar to Example 1 except the additive. Elements of Cu and Al or an alloy of them are/is dissolvable in $Fe_2TiSi$ type alloy powder although the amount is small.

FIG. 4 is a photograph obtained by polishing the surface of a sintered body produced according to the present example and observing the structure by energy dispersive X-ray spectroscopy with a scanning electron microscope. The coating layer formed from the CuAl additive (blackish parts) is formed in the manner of covering the secondary crystal grains (whitish parts). The dimensionless figure-of-merit ZT of the obtained thermoelectric conversion material was 0.135.

In this way, according to the present example, it is possible to provide a $Fe_2TiSi$ type full-Heusler thermoelectric conversion material having a high dimensionless figure-of-merit ZT. Further it is possible to provide a method for producing a $Fe_2TiSi$ type full-Heusler thermoelectric conversion material having a high dimensionless figure-of-merit ZT.

Comparative Example 1

An additive comprising Bi (hereunder referred to as a Bi additive) was used as the additive and experiment and evaluation were carried out by using the raw material powder and the conditions similar to Example 1 except the additive. Bi is an element indissoluble in $Fe_2TiSi$ type alloy powder.

FIG. 5 is a photograph obtained by polishing the surface of a sintered body produced according to the present comparative example and observing the structure by energy dispersive X-ray spectroscopy with a scanning electron microscope. Precipitation of Bi (blackish parts) is recognized but, unlike Examples 1 and 2, has the form of precipitating locally at the grain boundaries of the secondary crystal grains. The reason is estimated to be that Bi does not dissolve in the $Fe_2TiSi$ type alloy powder and hence precipitates locally in order to minimize surface energy. Further, the electric resistivity ρ of the sintered body also was the same as that of a material to which an additive was not added and the effect of improving a dimensionless figure-of-merit ZT was not obtained.

Example 3

Example 3 according to the present invention is explained. Here, the items described in Example 1 or 2 but not described in the present example can apply also to the present example unless otherwise specified. In the present example, cases of changing an addition amount of an additive are explained.

An MgAl additive used in Example 1 was used as the additive. The addition amounts were set at 2 vol % and 6 vol % of the total amount of the mixed powder. Production and evaluation were carried out by using the raw material powder and the conditions similar to Example 1 except the additive.

Figure 6:
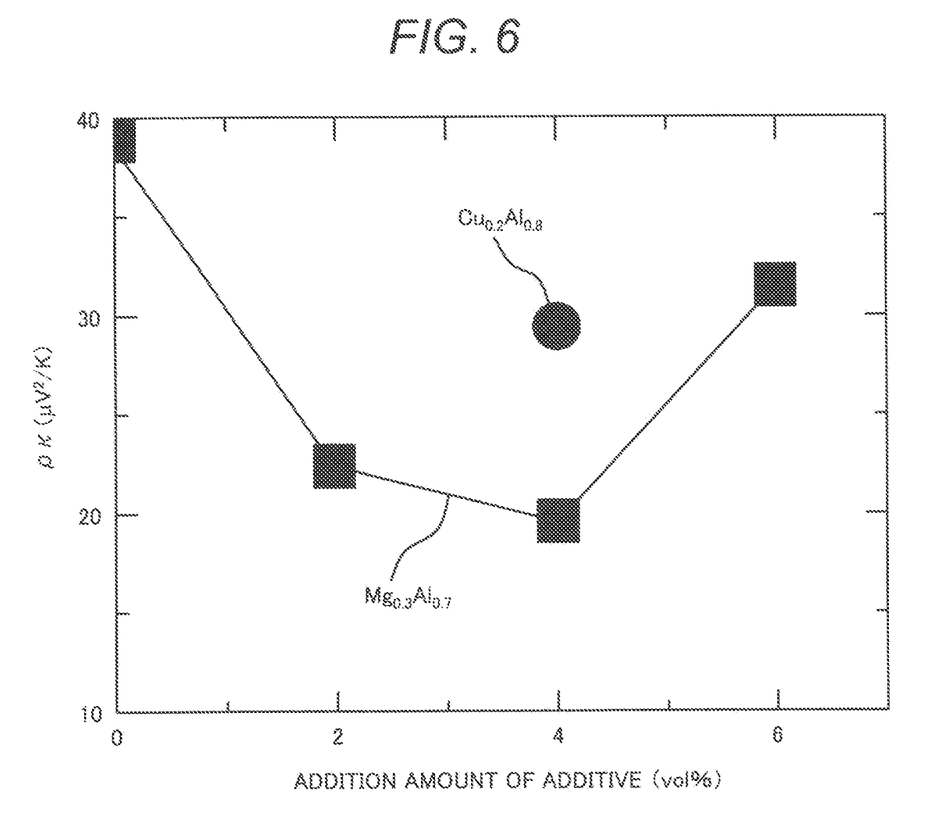
FIG. 6 is a graph showing a relationship between an addition amount of an additive and a product ρκ of a thermal conductivity and an electric resistivity in thermoelectric conversion materials according to Example 3 of the present invention (including the cases of not adding an additive and Examples 1 and 2).

FIG. 6 is a graph showing a relationship between an addition amount of an additive and a product ρκ of an electric resistivity ρ and a thermal conductivity κ in thermoelectric conversion materials according to the present example. For reference, the measured values of Example 1 (the MgAl additive is used and the addition amount is 4 vol %) and Example 2 (the CuAl additive is used and the addition amount is 4 vol %) are also shown together. Further, as a comparative example, the case of not adding an additive (an addition amount is zero) is also shown.

In the thermoelectric conversion material to which no additive was added, the value of ρκ was 38.9 μV$^2$/K. In contrast, in the thermoelectric conversion materials to which 2 vol %, 4 vol %, and 6 vol % of the MgAl additive were added respectively, the values of ρκ were lower than the above value (22.5 μV$^2$/K, 19.6 μV$^2$/K, and 31.6 μV$^2$/K).

In particular, in the case of the thermoelectric conversion material, to which 4 vol % of the MgAl additive was added, of Example 1 showing the lowest ρκ value, the product ρκ of the thermal conductivity and the electric resistivity was reduced by about 50% from the case of zero addition amount.

Figure 7:
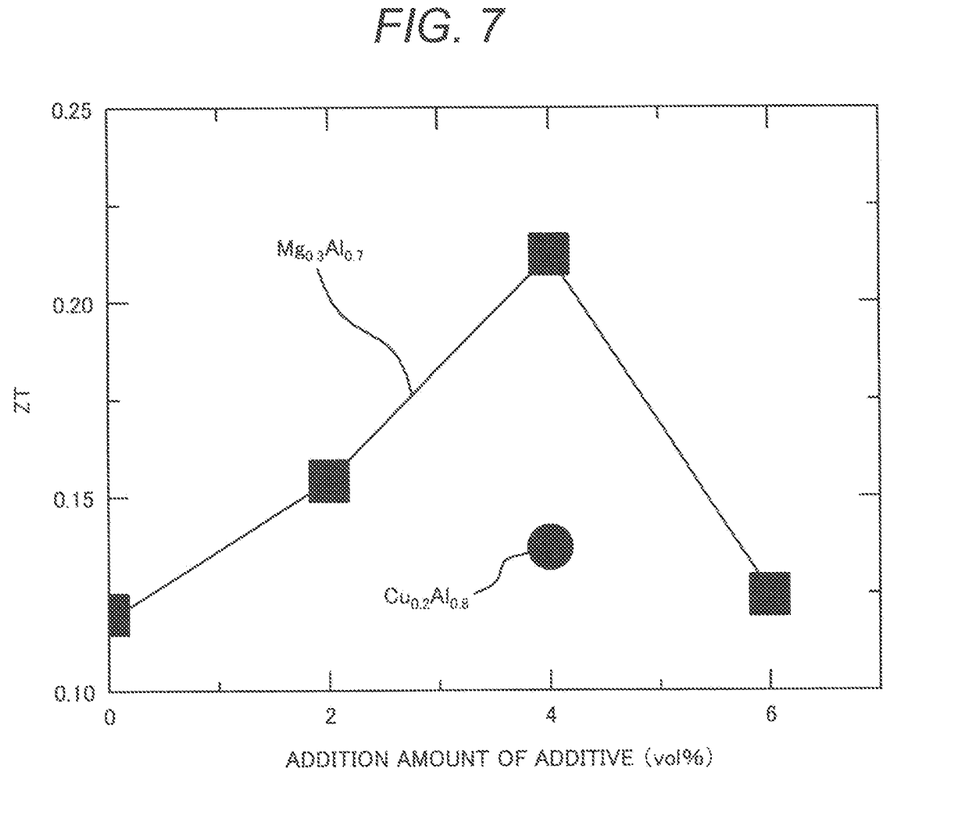
FIG. 7 is a graph showing a relationship between an addition amount of an additive and a dimensionless figure-of-merit ZT in thermoelectric conversion materials according to Example 3 of the present invention (including the cases of not adding an additive and Examples 1 and 2).

FIG. 7 is a graph showing a relationship between an addition amount of an additive and a dimensionless figure-of-merit ZT in the thermoelectric conversion materials according to the present example. Similarly to FIG. 6, the measured values of Example 1 (the MgAl additive was used and the addition amount was 4 vol %) and Example 2 (the CuAl additive was used and the addition amount was 4 vol %) are also shown together.

In the thermoelectric conversion material to which no additive was added, the dimensionless figure-of-merit ZT was 0.120. In contrast, in the thermoelectric conversion materials to which 2 vol % to 6 vol % of the MgAl additive were added, the dimensionless figure-of-merits ZT (0.154, 0.213, and 0.123) were larger than the above case. In particular, in the case of the thermoelectric conversion material, to which 4 vol % of the MgAl additive was added, showing the largest dimensionless figure-of-merit ZT, the dimensionless figure-of-merit ZT increased by about 78% from the case of zero addition amount.

In this way, according to the present example, it is possible to provide a Fe$_2$TiSi type full-Heusler thermoelectric conversion material having a high dimensionless figure-of-merit ZT. Further it is possible to provide a method for producing a Fe$_2$TiSi type full-Heusler thermoelectric conversion material having a high dimensionless figure-of-merit ZT.

Example 4

Example 4 according to the present invention is explained. Here, the items described in any one of Examples 1 to 3 but not described in the present example can apply also to the present example unless otherwise specified. In the present example, simulation of thermoelectric conversion efficiency was carried out on the assumption that a thermoelectric conversion material produced in Example 1 was used in a thermoelectric conversion module shown in FIG. 8. Both the values ZT of an N-type thermoelectric conversion material and a P-type thermoelectric conversion material were assumed to be 0.213 of Example 1. Further, the dimensions of the electrodes 203a and 203b and the heat transfer materials 204a and 204b were determined so that the sum of the thermal resistances of the electrodes 203a and 203b and the heat transfer materials 204a and 204b may be one tenth of the thermal resistance of the thermoelectric conversion material. The temperature of the heat transfer material 204a on the high temperature side was set at 200° C. and the temperature of the heat transfer material 204b on the low temperature side was set at 50° C. The thermoelectric conversion efficiency of the thermoelectric conversion module under the conditions was about 2.0%.

For comparison, similar experiment was carried out with a thermoelectric conversion material to which no additive was added and the thermoelectric conversion efficiency was about 1.2%.

The simulation result that that the thermoelectric conversion efficiency of the thermoelectric conversion material according to Example 1 increased to 1.7 times that of a conventional thermoelectric conversion material (the thermoelectric conversion efficiency was 2.0% and increased by 0.8% from the conventional material) was obtained. Here, although the material shown in Example 1 was used as both the P-type and N-type thermoelectric conversion materials in the present example, the effect of improving thermoelectric conversion efficiency can be obtained also by using the material shown in Example 1 as at least either of the P-type and N-type thermoelectric conversion materials. It goes without saying however that the thermoelectric conversion efficiency improves further by applying the material to both the P-type and N-type thermoelectric conversion materials.

In this way, according to the present example, it is possible to provide a thermoelectric conversion module of a high thermoelectric conversion efficiency by using a Fe$_2$TiSi type full-Heusler thermoelectric conversion material having a high dimensionless figure-of-merit ZT.

Meanwhile, the present invention is not limited to the above examples and includes various modifications. For example, the above examples are explained precisely in order to make the present invention easy to understand and the present invention is not necessarily limited to the cases having all the configurations explained. Further, it is possible to: replace a part of a configuration of an example with a configuration of another example; and also add a configuration of an example to a configuration of another example. Furthermore, a part of a configuration of each example can be added to, deleted from, or replaced with another configuration.

REFERENCE SIGNS LIST

101 . . . secondary crystal grain,
102 . . . coating layer,
201 . . . N-type thermoelectric conversion material
202 . . . P-type thermoelectric conversion material
203a, 203b . . . electrode
204a, 204b . . . heat transfer material

The invention claimed is:

1. A thermoelectric conversion material comprising a full-Heusler alloy containing Fe, Ti, and Si as main raw materials, having:
    secondary crystal grains having an Fe2TiSi type composition; and
    a coating layer covering the circumference of the secondary crystal grains and containing an element other than Fe, Ti, and Si as a main component, wherein
    the coating layer has a composition containing an element being dissolvable in a crystal structure of the Fe2TiSi type composition and having an electric resistivity lower than the secondary crystal grains.

2. A thermoelectric conversion material according to claim 1, wherein the coating layer has a composition containing at least one element selected from the group of Li, Mg, Al, Cu, Zn, Sn, Ba, and Pb as a main component.

3. A thermoelectric conversion material according to claim 1, wherein a composition of the secondary crystal grains is represented by $Fe_2(Ti_{1-a}M1_a)(Si_{1-b}M2_b)$ (here, M1 is a composition comprising at least one element selected from the group of V, Ru, Cr, Mn, Co, Ni, Cu, Zr, Nb, Mo, Hf, Ta, W, and Ir, M2 is a composition comprising at least one element selected from the group of Cu, Al, Ge, In, Sn, and Ga, and the expressions $0 \le a \le 0.2$ and $0 \le b \le 0.2$ are satisfied).

4. A thermoelectric conversion module using a thermoelectric conversion material according to any one of claim 1.

5. A thermoelectric conversion module having a plurality of thermoelectric conversion elements each of which has a P-type thermoelectric conversion material, an N-type thermoelectric conversion material, and an electrode connecting the P-type thermoelectric conversion material and the N-type thermoelectric conversion material,
    wherein at least either of the N-type thermoelectric conversion material and the P-type thermoelectric conversion material is a thermoelectric conversion material which comprises a full-Heusler alloy containing Fe, Ti, and Si as main raw materials and has secondary crystal grains having an Fe2TiSi type composition and a coating layer covering the circumference of the secondary crystal grains and containing an element other than Fe, Ti, and Si as a main component; and
    the coating layer has a composition containing an element being dissolvable in a crystal structure of the Fe2TiSi type composition and having an electric resistivity lower than the secondary crystal grains.

6. A method for producing a thermoelectric conversion material, comprising the steps of:
    producing alloy powder of an alloy having a composition of an Fe2TiSi type;
    adding an additive having a composition containing an element other than Fe, Ti, and Si, the element being dissolvable in the alloy powder and having an electric resistivity lower than the alloy to the alloy powder; and
    sintering a mixture of the alloy powder and the additive so as not completely to dissolve.

7. A method for producing a thermoelectric conversion material according to claim 6, wherein, as the additive, at least one element selected from the group of Li, Mg, Al, Cu, Zn, Sn, Ba, and Pb is used.

8. A method for producing a thermoelectric conversion material according to claim 6, wherein a composition of the secondary crystal grains is represented by $Fe_2(Ti_{1-a}M1_a)(Si_{1-b}M2_b)$ (here, M1 is a composition comprising at least one element selected from the group of V, Ru, Cr, Mn, Co, Ni, Cu, Zr, Nb, Mo, Hf, Ta, W, and Ir, M2 is a composition comprising at least one element selected from the group of Cu, Al, Ge, In, Sn, and Ga, and the expressions $0 \le a \le 0.2$ and $0 \le b \le 0.2$ are satisfied).

9. A method for producing a thermoelectric conversion material according to any one of claim 6, wherein the alloy powder is amorphized.

10. A method for producing a thermoelectric conversion material according to any one of claim 6, wherein an addition amount of the additive is more than 0 vol % to 6 vol % or less of the total amount of the alloy powder and the additive.

11. A method for producing a thermoelectric conversion material according to any one of claim 6, wherein a temperature during the sintering is from 450° C. to 800° C.

* * * * *